United States Patent
Yamamoto et al.

(10) Patent No.: US 8,785,791 B2
(45) Date of Patent: Jul. 22, 2014

(54) THROUGH WIRING SUBSTRATE AND MANUFACTURING METHOD THEREOF

(75) Inventors: Satoshi Yamamoto, Sakura (JP); Hirokazu Hashimoto, Sakura (JP)

(73) Assignee: Fujikura Ltd., Tokyo (JP)

( * ) Notice: Subject to any disclaimer, the term of this patent is extended or adjusted under 35 U.S.C. 154(b) by 19 days.

(21) Appl. No.: 13/344,091

(22) Filed: Jan. 5, 2012

(65) Prior Publication Data
US 2012/0103679 A1    May 3, 2012

Related U.S. Application Data

(63) Continuation of application No. PCT/JP2010/004139, filed on Jun. 22, 2010.

(30) Foreign Application Priority Data

Jul. 6, 2009   (JP) .................................. 2009-159869

(51) Int. Cl.
*H05K 1/11* (2006.01)
*H05K 1/00* (2006.01)

(52) U.S. Cl.
USPC .......................... 174/264; 174/252; 174/262

(58) Field of Classification Search
USPC ......................... 174/262–266, 252
See application file for complete search history.

(56) References Cited

U.S. PATENT DOCUMENTS

| | | | |
|---|---|---|---|
| 6,048,754 A * | 4/2000 | Katayama et al. | 438/115 |
| 6,665,185 B1 * | 12/2003 | Kulik et al. | 361/699 |
| 7,215,547 B2 * | 5/2007 | Chang et al. | 361/701 |
| 7,918,799 B2 * | 4/2011 | Haveri | 600/459 |
| 2006/0289199 A1 * | 12/2006 | Tan | 174/250 |
| 2009/0150327 A1 * | 6/2009 | Liu et al. | 706/52 |
| 2010/0158446 A1 * | 6/2010 | Ohta | 385/58 |
| 2010/0178006 A1 * | 7/2010 | Nishimura et al. | 385/55 |

FOREIGN PATENT DOCUMENTS

| | | |
|---|---|---|
| CN | 1216212 A | 5/1999 |
| JP | 03-237786 A | 10/1991 |
| JP | 04-236672 A | 8/1992 |

(Continued)

OTHER PUBLICATIONS

Office Action issued by the Japanese Patent Office in Japanese Application No. 2012-085795 dated May 15, 2012.

(Continued)

*Primary Examiner* — Hoa C Nguyen
(74) *Attorney, Agent, or Firm* — Sughrue Mion, PLLC

(57) ABSTRACT

A through wiring substrate includes a substrate having a first face and a second face; and a through-wire formed by filling, or forming a film of, an electrically-conductive substance into a through-hole, which penetrates between the first face and the second face. The through-hole has a bend part comprising an inner peripheral part that is curved in a recessed shape and an outer peripheral part that is curved in a protruding shape, in a longitudinal cross-section of the through-hole, and at least the inner peripheral part is formed in a circular arc shape in the longitudinal cross-section.

3 Claims, 6 Drawing Sheets

(56) References Cited

FOREIGN PATENT DOCUMENTS

| | | |
|---|---|---|
| JP | 06-325130 A | 11/1994 |
| JP | 2003-110206 A | 4/2003 |
| JP | 2004-363186 A | 12/2004 |
| JP | 2004-363535 A | 12/2004 |
| JP | 2006-303360 A | 11/2006 |
| JP | 2007-024551 A | 2/2007 |
| JP | 2007-288079 A | 11/2007 |
| JP | 2008-288577 A | 11/2008 |
| JP | 2008-300519 A | 12/2008 |

OTHER PUBLICATIONS

Office Action issued by the Japanese Patent Office in Japanese Application No. 2012-085795 dated Oct. 23, 2012.

Office Action issued by Japanese Patent Office in Japanese Application No. 2011-239709 dated Jan. 8, 2013.

Chinese Office Action corresponding to Chinese Patent Application No. 201080030000.6, dated Jan. 3, 2014. language Search Report.

* cited by examiner

THROUGH WIRING SUBSTRATE AND MANUFACTURING METHOD THEREOF

CROSS REFERENCE TO RELATED APPLICATIONS

This application is a continuation application based on a PCT Patent Application No. PCT/JP2010/004139, filed Jun. 22, 2010, whose priority is claimed on Japanese Patent Application No. 2009-159869 filed Jul. 6, 2009, the entire content of which is hereby incorporated by reference.

BACKGROUND OF THE INVENTION

1. Field of the Invention

The present invention relates to a through wiring substrate that has a through-wire which penetrates the interior of a substrate (interposer substrate with through-hole interconnection) and a manufacturing method thereof.

2. Description of the Related Art

Conventionally, a method of providing a through-wire that penetrates the interior of a substrate (through-hole interconnection) is used as a method of electrically connecting a first device, mounted on a first face which is one face of the substrate, to a second device, mounted on a second face which is another face of the substrate. The substrate with the through-wire is often called interposer.

As an example of a through wiring substrate (interposer), Patent Document 1 (Japanese Unexamined Patent Application, First Publication No. 2006-303360) describes a through wiring substrate including a through-wire made by filling an electrically-conductive substance into a microscopic hole having a section that extends in a direction different from the thickness direction of the base material.

An example of this is a through wiring substrate such as that shown in FIG. 8. This through wiring substrate 100 includes a through-wire 101, which is formed by providing a through-hole 104 that links one face of a substrate 102 made from silica glass or the like with one side face of the substrate 102, and filling an electrically-conductive substance 106 into the through-hole 104. The through-wire 101 has a substantially right-angled bend part, and a linear part 101b extending in the thickness direction of the substrate and a linear part 101a extending in a direction (long direction) that is different from the thickness direction of the substrate are connected at the substantially right-angled bend part.

When a through-wire provided in a conventional through wiring substrate has a substantially right-angled bend part, there is a problem that current concentrates in the inner peripheral part of the bend part, resulting in increased transmission loss of electrical signals, and in particular of high-frequency signals, via the through-wire. There is also a problem that an electrically-conductive substance filled by a method such as supercritical film formation method peels away from the through-hole at the sharp end parts of the bend parts, resulting in poor conductivity.

SUMMARY

The present invention has been realized in view of the above issues, and aims to provide a through wiring substrate and a manufacturing method thereof that reduce transmission loss of electrical signals such as high-frequency signals, and suppress poor conductivity due to peeling of the electrically-conductive substance from the through-hole.

A through wiring substrate according to an aspect of the invention includes: a substrate having a first face and a second face, and a through-wire formed by filling, or forming a film of, an electrically-conductive substance into a through-hole which penetrates between the first face and the second face. The through-hole has a bend part comprising an inner peripheral part that is curved in a recessed shape and an outer peripheral part that is curved in a protruding shape, in a longitudinal cross-section of the through-hole, and at least the inner peripheral part is formed in a circular arc shape in the longitudinal cross-section.

At least one of the outer peripheral part and the inner peripheral part can be formed in a circular arc shape with a radius of curvature within a range of 10 μm to 1000 μm in the longitudinal cross-section.

A flow path can be formed in the substrate.

A method of manufacturing a through wiring substrate according to another aspect of the invention is a method of manufacturing a substrate having a first face and a second face, and a through-wire formed by filling, or forming a film of, an electrically-conductive substance into a through-hole which penetrates between the first face and the second face, the through-hole has a bend part comprising an inner peripheral part that is curved in a recessed shape and an outer peripheral part that is curved in a protruding shape, in a longitudinal cross-section of the through-hole, and at least the inner peripheral part is formed in a circular arc shape in the longitudinal cross-section. The manufacturing method may include a process (A) of modifying a through-hole formation region that penetrates between the first face and the second face by irradiating laser light, a process (B) of removing the modified through-hole formation region to form the through-hole, and a process (C) of filling, or forming a film of, the electrically-conductive substance in the through-hole.

In the process (A), conditions of the laser irradiation can be controlled such that at least one of the outer peripheral part and the inner peripheral part is formed in a circular arc shape with a radius of curvature within a range of 10 μm to 1000 μm in the longitudinal cross-section.

In the process (A) and the process (B), in addition to forming the through-hole, a flow path can also be formed in the substrate.

In the process (A), the through-hole formation region and the flow path formation region can be modified by laser irradiation; and in the process (B), the modified through-hole formation region and the modified flow path formation region can be removed by etching.

According to the invention, it is possible to provide a through wiring substrate, and a manufacturing method thereof, that can reduce transmission loss of electrical signals such as high-frequency signals, and suppress poor conduction due to peeling of the electrically-conductive substance from the through-hole.

The through-wire provided in the through wiring substrate of the invention has a bend part. Of the outer peripheral part and the inner peripheral part of the longitudinal cross-section of this bend part, at least the inner peripheral part is a circular arc shape and thus does not have a sharp end part at least in the inner peripheral part. Therefore, since peeling of the electrically-conductive substance from the through-hole constituting the through-wire can be suppressed, poor conduction due to such peeling of the electrically-conductive substance can be suppressed.

When the outer peripheral part is also a circular arc shape, like the inner peripheral part, both the outer peripheral part and the inner peripheral part do not have sharp end parts. Therefore, poor conduction due to peeling of the electrically-conductive substance can be further suppressed.

Moreover, when at least one of the outer peripheral part and the inner peripheral part is formed in a circular arc shape, and this circular arc has a radius of curvature within a range of 10 µm to 1000 µm, the bend part is made smoother, whereby poor conduction due to peeling of the electrically-conductive substance can be even further suppressed.

The through-wire provided in the through wiring substrate of the invention has a bend part. Of the outer peripheral part and the inner peripheral part of the longitudinal cross-section of this bend part, at least the inner peripheral part is a circular arc shape and thus does not have a sharp end part at least in the inner peripheral part. Therefore, local concentration of current to the inner peripheral part is alleviated, and transmission loss of high-frequency signals and the like can be reduced.

Moreover, when at least one of the outer peripheral part and the inner peripheral part is formed in a circular arc shape, and this circular arc has a radius of curvature within a range of 10 µm to 1000 µm, the bend part is made smoother, whereby transmission loss of high-frequency signals and the like can be further reduced.

DETAILED DESCRIPTION OF THE PREFERRED EMBODIMENTS

Embodiments of the invention will be explained with reference to the drawings.

Figure 1:
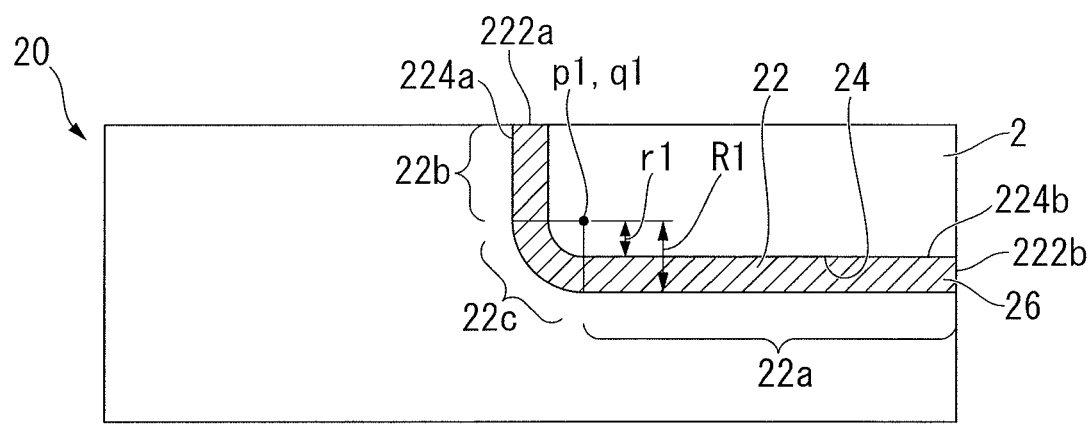
FIG. 1 is a cross-sectional view showing a through wiring substrate according to a first embodiment of the invention.

FIG. 1 is a cross-sectional view of a through wiring substrate 20 according to a first embodiment of the invention. The through wiring substrate 20 includes a through-wire 22. The through-wire 22 is formed by providing a through-hole 24 that penetrates between one face (a top face or a bottom face; first face) constituting a single substrate 2 and one side face (second face), and filling, or forming a film of, an electrically-conductive substance 26 into this through-hole 24. The through-hole 24 has a bend part (curved part) 22c. The outer peripheral part and inner peripheral part of the longitudinal cross-section of this bend part 22c are formed in a circular arc shape. As shown in FIG. 1, this bend part, in the longitudinal cross-section, includes an inner peripheral part that is curved in a recessed shape, and an outer peripheral part that is curved in a protruding shape. The through-hole 24 includes a linear part 22b, the bend part 22c, and a linear part 22a, which are continuously disposed. The through-hole 24 is such before the electrically-conductive substance 26 is filled or film formed in it; after the electrically-conductive substance 26 has been filled or film formed in it, the through-hole 24 becomes the through-wire 22. For this reason, the explanation below sometimes states that the through-hole 24 includes the bend part 22c, and sometimes states that the through-wire 22 includes the bend part 22c.

The cross-section of the through wiring substrate 20 is a longitudinal cross-section view along a center line of the through-wire 22. One end of the through-wire 22 is a first conductive part 222a (first opening 224a of the through-hole) exposed at one face (first face) of the through wiring substrate 20. A linear part 22b extends from one end of the through-wire 22 in the thickness direction of the substrate 2 (the direction when looking from the one face to the other face; e.g. when looking from the top face to the bottom face) and reaches the circular arc-shaped bend part 22c. The linear part 22a extends from the bend part 22c in a direction parallel with both faces of the substrate 2, and reaches a second conductive part 222b (second opening 224b of the through-hole) exposed at one side face (second face) of the substrate 2. The second conductive part 222b is another end of the through-wire 22.

In the through-wire 22, the bend part 22c that smoothly connects the linear part 22b extending in the thickness direction of the substrate 2 to the linear part 22a extending in the direction parallel with both faces of the substrate 2 is formed in a circular arc shape.

When the bend part 22c is formed in a circular arc shape, at the cross-section along the center line of the bend part 22c (longitudinal cross-section), the outer peripheral part and inner peripheral part of the bend part 22c are also formed in a circular arc shape.

While it is acceptable if only the inner peripheral part of the bend part 22c is formed in a circular arc shape, to obtain superior effects of the invention it is preferable that both the outer peripheral part and the inner peripheral part are formed in a circular arc shape.

Similar effects to those of the invention can be expected when the circular arc shape is substantially circular, such as, for example, a multi-angular shape that is inscribed or circumscribed with the circular arc, or a curved-line shape that meanders along the circular arc.

In FIG. 1, the outer peripheral part of the bend part 22c is a quadrant of a circular arc part with a center at q1 and a radius of R1, and the inner peripheral part of the bend part 22c is a quadrant of a circular arc part with a center at p1 and a radius of r1.

Preferably, the centers q1 and p1 of the two quadrants are at the same position, and radius R1>radius r1. The difference between radius R1 and radius r1 is preferably equal to the diameter of the through-wire 22 at least in the linear part 22b and the linear part 22a. This enables the linear part 22b and the linear part 22a to be more smoothly connected via the bend part 22c, and can enhance the effects of the invention.

When the outer peripheral part and/or the inner peripheral part of the bend part 22c (at least one of the outer peripheral part and the inner peripheral part) is formed in a circular arc shape, their radii of curvature (R1 and r1) depend on the diameter of the through-wire 22 and the thickness of the substrate 2, and are preferably within a range of 10 µm to 1000 µm. Radii of curvature within this range enable the linear part 22b and the linear part 22a to be more smoothly connected via the bend part 22c, and can further enhance the effects of the invention.

The thickness of the through wiring substrate 20 of FIG. 1 is 300 µm, R1 is 90 µm, r1 is 50 µm, and the diameter of the through-wire 22 is 40 μm. These numerical values represent one example of the through wiring substrate 20 according to the first embodiment of the invention; the thickness of the substrate, the radii of curvature (R1 and r1), and the diameter of the through-wire, and the like, can be changed as appropriate where necessary.

Figure 2:
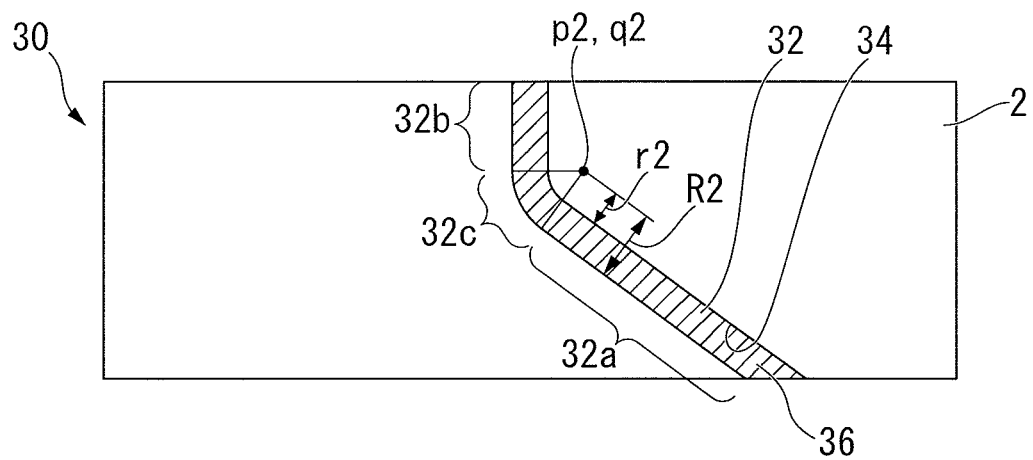
FIG. 2 is a cross-sectional view showing a through wiring substrate according to a second embodiment of the invention.

FIG. 2 is a cross-sectional view of a through wiring substrate 30 according to a second embodiment of the invention. The through wiring substrate 30 includes a through-wire 32, which is formed by providing a through-hole 34 that penetrates between one face (a top face or a bottom face; first face) and another face (a bottom face or a top face; second face) constituting a single substrate 2, and filling, or forming a film of, an electrically-conductive substance 36 in this through-hole 34. The through-hole 34 has a bend part (curved part) 32c, and the outer peripheral part and inner peripheral part of the longitudinal cross-section of the bend part 32c are formed in a circular arc shape.

The cross-section of the through wiring substrate 30 of FIG. 2 is a longitudinal cross-section along the center line of the through-wire 32. One end of the through-wire 32 is a first conductive part exposed at one face (first face) of the through wiring substrate 30. A linear part 32b extends from one end of the through-wire 32 in the thickness direction of the substrate 2 (the direction when looking from the one face to the other face; e.g. when looking from the top face to the bottom face) and reaches the circular arc-shaped bend part 32c. The linear part 32a extends from the bend part 32c in a direction different from the thickness direction of the substrate 2 (a direction intersecting the thickness direction), and reaches a second conductive part exposed at another face (second face) of the substrate 2. This second conductive part is another end of the through-wire 32.

In the through-wire 32, the bend part 32c that smoothly connects the linear part 32b extending in the thickness direction of the substrate 2 to the linear part 32a extending in the direction different from the thickness direction of the substrate 2 (the direction intersecting the thickness direction) is formed in a circular arc shape.

When the bend part 32c is formed in a circular arc shape, at the cross-section along the center line of the bend part 32c (longitudinal cross-section), the outer peripheral part and inner peripheral part of the bend part 32c are also formed in a circular arc shape.

While it is acceptable if only the inner peripheral part of the bend part 32c is formed in a circular arc shape, to obtain superior effects of the invention it is preferable that both the outer peripheral part and the inner peripheral part are formed in a circular arc shape.

Similar effects to those of the invention can be expected when the circular arc shape is substantially circular, such as, for example, a multi-angular shape that is inscribed or circumscribed with the circular arc, or a curved-line shape that meanders along the circular arc.

In FIG. 2, the outer peripheral part of the bend part 32c is an octant of a circular arc part with a center at q2 and a radius of R2, and the inner peripheral part of the bend part 32c is an octant of a circular arc part with a center at p2 and a radius of r2.

Preferably, the centers q2 and p2 of the two octants are at the same position, and radius R2>radius r2. The difference between radius R2 and radius r2 is preferably equal to the diameter of the through-wire 32 at least in the linear part 32b and the linear part 32a. This enables the linear part 32b and the linear part 32a to be more smoothly connected via the bend part 32c, and can enhance the effects of the invention.

When the outer peripheral part and/or the inner peripheral part of the bend part 32c (at least one of the outer peripheral part and the inner peripheral part) is formed in a circular arc shape, their radii of curvature (R2 and r2) depend on the diameter of the through-wire 32 and the thickness of the substrate 2, and are preferably within a range of 10 μm to 1000 μm. Radii of curvature within this range enable the linear part 32b and the linear part 32a to be more smoothly connected via the bend part 32c, and can further enhance the effects of the invention.

The thickness of the through wiring substrate 30 of FIG. 2 is 300 μm, R2 is 110 μm, r2 is 65 μm, and the diameter of the through-wire 32 is 45 μm. As mentioned above, these numerical values represent one example of the through wiring substrate 30 according to the second embodiment of the invention, and can be changed as appropriate where necessary.

Figure 3:
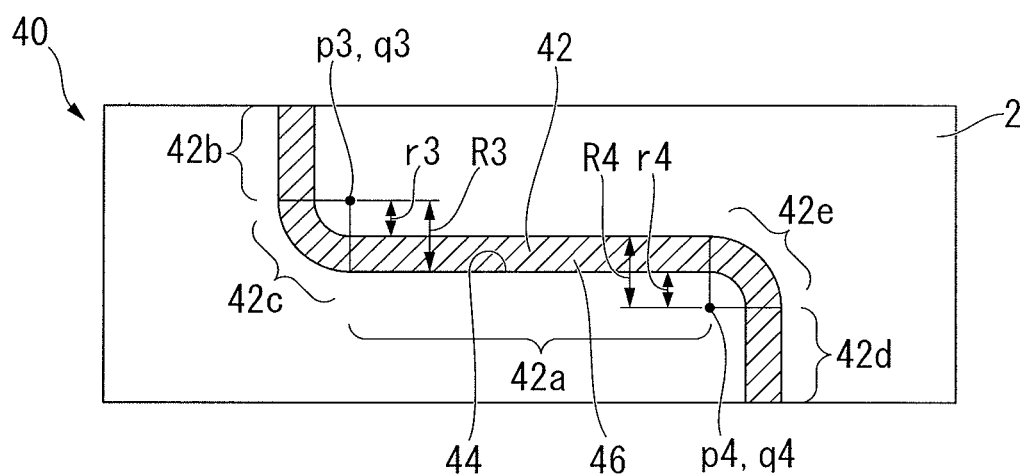
FIG. 3 is a cross-sectional view showing a through wiring substrate according to a third embodiment of the invention.

FIG. 3 is a cross-sectional view of a through wiring substrate 40 according to a third embodiment of the invention. The through wiring substrate 40 includes a through-wire 42, which is formed by providing a through-hole 44 that penetrates between one face (a top face or a bottom face; first face) and another face (a bottom face or a top face; second face) constituting a single substrate 2, and filling, or forming a film of, an electrically-conductive substance 46 in this through-hole 44. The through-hole 44 has a first bend part 42c and a second bend part 42e. The outer peripheral part and inner peripheral part of the longitudinal cross-section of the first bend part 42c, and the outer peripheral part and the inner peripheral part of the longitudinal cross-section of the second bend part 42e are each formed in a circular arc shape. In other words, the through-wire includes the first bend part 42c and the second bend part 42e, and the outer peripheral parts and inner peripheral parts of the first bend part 42c and the second bend part 42e are formed in a circular arc shape.

The cross-section of the through wiring substrate 40 of FIG. 3 is a longitudinal cross-section along the center line of the through-wire 42. One end of the through-wire 42 is a first conductive part exposed at one face (first face) of the through wiring substrate 40. A linear part 42b extends from one end of the through-wire 42 in the thickness direction of the substrate 2 (the direction when looking from the one face to the other face; e.g. when looking from the top face to the bottom face) and reaches the circular arc-shaped first bend part 42c. The linear part 42a extends from the first bend part 42c in parallel with both faces of the substrate 2, and reaches a circular arc-shaped second bend part 42e. A linear part 42d extends from the second bend part 42e in the thickness direction of the substrate 2, and reaches a second conductive part exposed at another face (second face) of the substrate 2. This second conductive part is another end of the through-wire 42.

In the through-wire 42, the first bend part 42c that smoothly connects the linear part 42b extending in the thickness direction of the substrate 2 to the linear part 42a extending in the direction parallel with both faces of the substrate 2 is formed in a circular arc shape.

When the first bend part 42c is formed in a circular arc shape, at the cross-section along the center line of the first bend part 42c (longitudinal cross-section), the outer peripheral part and inner peripheral part of the first bend part 42c are also formed in a circular arc shape.

While it is acceptable if only the inner peripheral part of the first bend part 42c is formed in a circular arc shape, to obtain superior effects of the invention it is preferable that both the outer peripheral part and the inner peripheral part are formed in a circular arc shape.

Similar effects to those of the invention can be expected when the circular arc shape is substantially circular, such as, for example, a multi-angular shape that is inscribed or circumscribed with the circular arc, or a curved-line shape that meanders along the circular arc.

In the through-wire 42, the second bend part 42e that smoothly connects the linear part 42a extending in the direction parallel with both faces of the substrate 2 to the linear part 42d extending in the thickness direction of the substrate 2 is formed in a circular arc shape.

When the second bend part 42e is formed in a circular arc shape, at the cross-section along the center line of the second bend part 42e (longitudinal cross-section), the outer peripheral part and inner peripheral part of the second bend part 42e are also formed in a circular arc shape.

While it is acceptable if only the inner peripheral part of the second bend part 42e is formed in a circular arc shape, to obtain superior effects of the invention it is preferable that both the outer peripheral part and the inner peripheral part of the second bend part 42e are formed in a circular arc shape.

Similar effects to those of the invention can be expected when the circular arc shape is substantially circular, such as, for example, a multi-angular shape that is inscribed or circumscribed with the circular arc, or a curved-line shape that meanders along the circular arc.

In FIG. 3, the outer peripheral part of the first bend part 42c is a quadrant of a circular arc part with a center at q3 and a radius of R3, and the inner peripheral part of the first bend part 42c is a quadrant of a circular arc part with a center at p3 and a radius of r3.

Preferably, the centers q3 and p3 of the two quadrants are at the same position, and radius R3>radius r3. The difference between radius R3 and radius r3 is preferably equal to the diameter of the through-wire 42 at least in the linear part 42b extending in the thickness direction of the substrate 2 and the linear part 42a extending in a direction parallel with both faces of the substrate 2. This enables the linear part 42b extending in the thickness direction of the substrate 2 and the linear part 42a extending in a direction parallel with both faces of the substrate 2 to be more smoothly connected via the first bend part 42c, and can further enhance the effects of the invention.

In FIG. 3, the outer peripheral part of the second bend part 42e is a quadrant of a circular arc part with a center at q4 and a radius of R4, and the inner peripheral part of the second bend part 42e is a quadrant of a circular arc part with a center at p4 and a radius of r4.

Preferably, the centers q4 and p4 of the two quadrants are at the same position, and radius R4>radius r4. The difference between radius R4 and radius r4 is preferably equal to the diameter of the through-wire 42 at least in the linear part 42a extending in a direction parallel with both faces of the substrate 2 and the linear part 42d extending in the thickness direction of the substrate 2. This enables the linear part 42a extending in a direction parallel with both faces of the substrate 2 and the linear part 42d extending in the thickness direction of the substrate 2 to be more smoothly connected via the second bend part 42e, and can further enhance the effects of the invention.

When the outer peripheral part and/or the inner peripheral part of the first bend part 42c (at least one of the outer peripheral part and the inner peripheral part) is formed in a circular arc shape, their radii of curvature (R3 and r3) depend on the diameter of the through-wire 42 and the thickness of the substrate 2, and are preferably within a range of 10 μm to 1000 μm. Radii of curvature within this range enable the linear part 42b extending in the thickness direction of the substrate 2 and the linear part 42a extending in a direction parallel with both faces of the substrate 2 to be more smoothly connected via the first bend part 42c, and can further enhance the effects of the invention.

The thickness of the through wiring substrate 40 of FIG. 3 is 300 μm, R3 is 90 μm, r3 is 50 μm, and the diameter of the through-wire 42 is 40 μm.

When the outer peripheral part and/or the inner peripheral part of the second bend part 42e (at least one of the outer peripheral part and the inner peripheral part) is formed in a circular arc shape, their radii of curvature (R4 and r4) depend on the diameter of the through-wire 42 and the thickness of the substrate 2, and are preferably within a range of 10 μm to 1000 μm. Radii of curvature within this range enable the linear part 42a extending in a direction parallel with both faces of the substrate 2 and the linear part 42d extending in the thickness direction of the substrate 2 to be more smoothly connected via the second bend part 42e, and can further enhance the effects of the invention.

The thickness of the through wiring substrate 40 of FIG. 3 is 300 μm, R4 is 90 μm, r4 is 50 μm, and the diameter of the through-wire 42 is 40 μm. As mentioned above, these numerical values represent one example of the through wiring substrate 40 according to the third embodiment of the invention, and can be changed as appropriate where necessary.

The first bend part 42c and the second bend part 42e can have the same shape as each other, or different shapes. That is, R3 and R4 can be the same as each other, or different; the same goes for r3 and r4.

Figure 4:
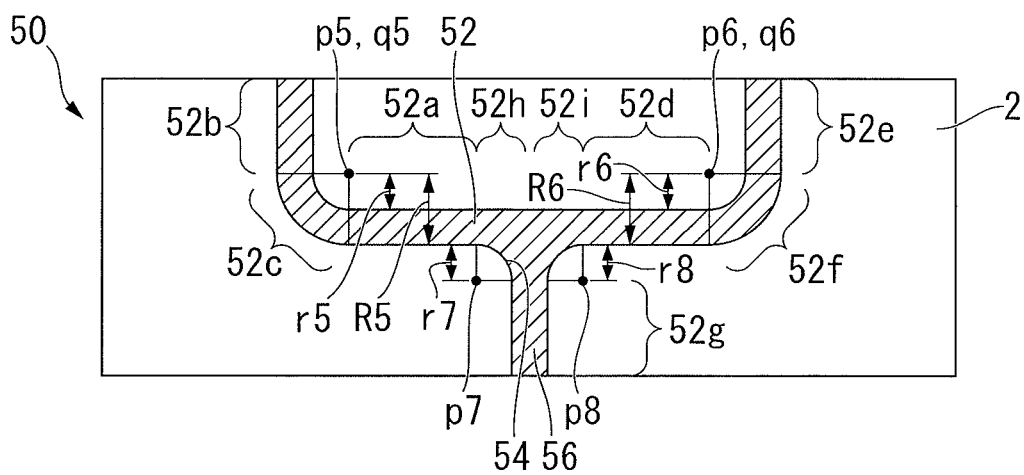
FIG. 4 is a cross-sectional view showing a through wiring substrate according to a fourth embodiment of the invention.

FIG. 4 is a cross-sectional view of a through wiring substrate 50 according to a fourth embodiment of the invention. The through wiring substrate 50 includes a through-wire 52, which is formed by providing a through-hole 54 that penetrates between one face (a top face or a bottom face; first face) and another face (a bottom face or a top face; second face) constituting a single substrate 2, and filling, or forming a film of, an electrically-conductive substance 56 in this through-hole 54. The through-hole 54 has a first bend part 52c, a second bend part 52h, a third bend part 52i, and a fourth bend part 52f. The outer peripheral part and inner peripheral part of the longitudinal cross-section of the first bend part 52c, the inner peripheral part of the longitudinal cross-section of the second bend part 52h, the inner peripheral part of the longitudinal cross-section of the third bend part 52i, and the outer peripheral part and the inner peripheral part of the longitudinal cross-section of the fourth bend part 52f are each formed in a circular arc shape.

The cross-section of the through wiring substrate 50 of FIG. 4 is a longitudinal cross-section along the center line of the through-wire 52. The through-wire 52 includes a first conductive part exposed at one face (first face), a second conductive part exposed at one face (first face), and a third conductive part exposed at another face (second face). A first linear part 52b extends from the first conductive part in the thickness direction of the substrate 2 (the direction when looking from the one face to another face; e.g. when looking from the top face to the bottom face) and reaches the first bend part 52c. The second linear part 52a extends from the first bend part 52c in a direction parallel with both faces of the substrate 2, and reaches a branched part formed by the second bend part 52h and the third bend part 52i. From this branched part, moreover, a third linear part 52d extends in a direction parallel with both faces of the substrate 2 and reaches the fourth bend part 52f. A fourth linear part 52e extends from the second conductive part in the thickness direction of the substrate 2, and reaches the fourth bend part 52f. Moreover, a fifth linear part 52g extends from the branched part in the thickness direction of the substrate 2, and reaches a third conductive part exposed at the another face (second face).

In the through-wire 52, the first bend part 52c that smoothly connects the first linear part 52b and the second linear part 52a is formed in a circular arc shape.

In the through-wire 52, the fourth bend part 52f that smoothly connects the fourth linear part 52e and the third linear part 52d is formed in a circular arc shape.

The explanation of the first bend part 52c and the fourth bend part 52f is the same as that of the bend part 22c of the through wiring substrate 20. Incidentally, the first bend part 52c and the fourth bend part 52f can be the same shape as each other, or they can be different shapes.

As shown in FIG. 4, the branched part is formed from the second bend part 52h and the third bend part 52i.

The second bend part 52h smoothly connects the second linear part 52a and the fifth linear part 52g.

The third bend part 52i smoothly connects the third linear part 52d and the fifth linear part 52g.

At the cross-section (longitudinal cross-section) along the center line of the second bend part 52h, the outer peripheral part of the second bend part 52h has a linear shape, whereas the inner peripheral part of the second bend part 52h is formed in a circular arc shape. The inner peripheral part of the second bend part 52h is preferably formed in a smooth circular arc shape, since this obtains superior effects of the invention and enables the second linear part 52a and the fifth linear part 52g to be smoothly connected.

At the cross-section (longitudinal cross-section) along the center line of the third bend part 52i, the outer peripheral part of the third bend part 52i has a linear shape, whereas the inner peripheral part of the third bend part 52i is formed in a circular arc shape. The inner peripheral part of the third bend part 52i is preferably formed in a smooth circular arc shape, since this obtains superior effects of the invention and enables the third linear part 52d and the fifth linear part 52g to be smoothly connected.

Similar effects to those of the invention can be expected when the circular arc shape is substantially circular, such as, for example, a multi-angular shape that inscribed or circumscribed with the circular arc, or a curved-line shape that meanders along the circular arc.

In FIG. 4, the inner peripheral part of the second bend part 52h is a quadrant of a circular arc part with a center at p7 and a radius of r7, and the inner peripheral part of the third bend part 52i is a quadrant of a circular arc part with a center at p8 and a radius of r8.

Preferably, the quadrant radii r7 and r8 are the same length, and these two quadrants are in line symmetry with respect to the center line of the fifth linear part 52g. That is, the second bend part 52h and the third bend part 52i are preferably in line symmetry with respect to the center line of the fifth linear part 52g. This enables the second linear part 52a, the third linear part 52d, and the fifth linear part 52g to be smoothly connected via the branched part formed by the second bend part 52h and the third bend part 52i, and can further enhance the effects of the invention.

When the inner peripheral part of the second bend part 52h and the inner peripheral part of the third bend part 52i are each formed in a circular arc shape, their radii of curvature (r7 and r8) depend on the diameter of the through-wire 52 and the thickness of the substrate 2, and are preferably within a range of 10 μm to 1000 μm. Radii of curvature within this range enable the second linear part 52a and the fifth linear part 52g to be more smoothly connected via the second bend part 52h. Moreover, the third linear part 52d and the fifth linear part 52g can be more smoothly connected via the third bend part 52i, and the effects of the invention can be further enhanced.

The thickness of the through wiring substrate 50 of FIG. 4 is 300 μm, R5 and R6 are 90 μm, r5 to r8 are 50 μm, and the diameter of the through-wire 52 is 40 μm. As mentioned above, these numerical values represent one example of the through wiring substrate 50 according to the fourth embodiment of the invention, and can be set as appropriate where necessary.

The first bend part 52c and the fourth bend part 52f can be the same shape as each other, or they can be different shapes. That is, the radii of curvature R5 and R6, and the radii of curvature r5 and r6, can each be the same as each other, or they can be different. Similarly, the second bend part 52h and the third bend part 52i can be the same shape as each other, or they can be different shapes. That is, the radii of curvature r7 and r8 can each be the same as each other, or they can be different.

Figure 5A:
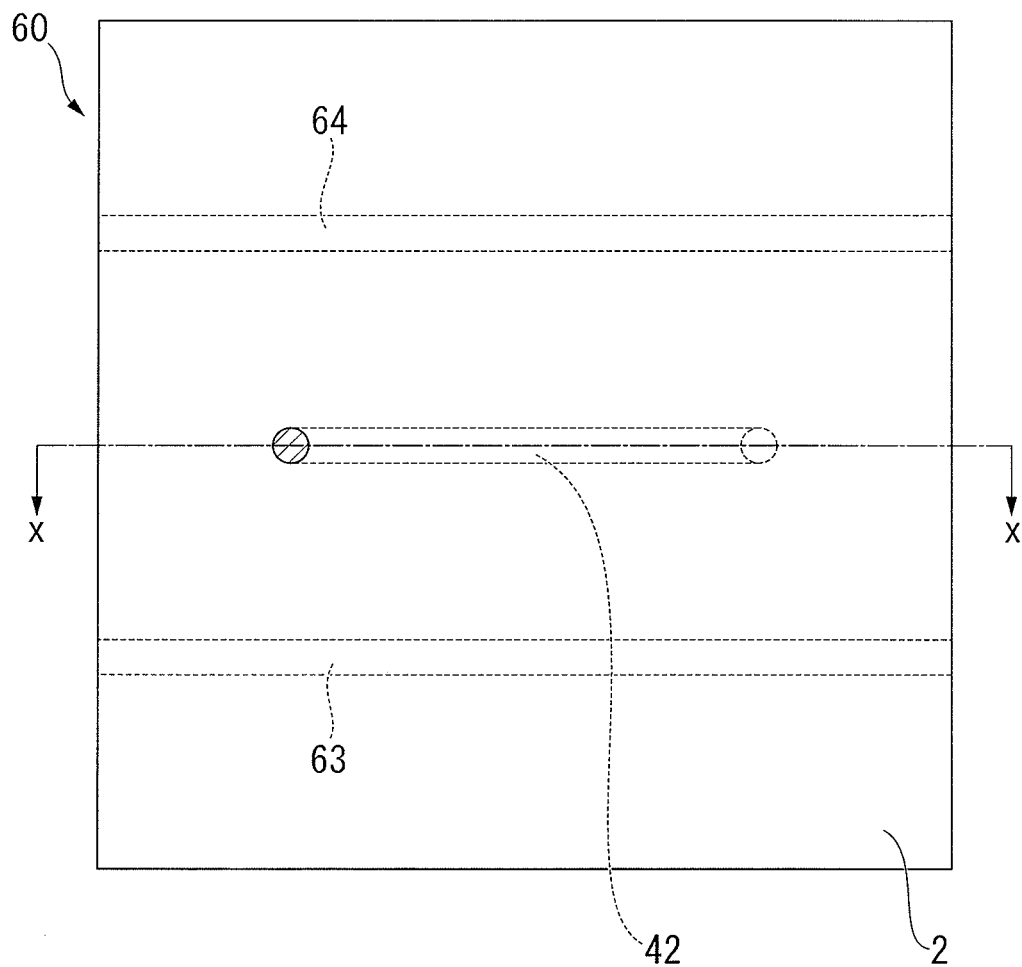
FIG. 5A is a plan view showing a through wiring substrate according to a fifth embodiment of the invention.
Figure 5B:
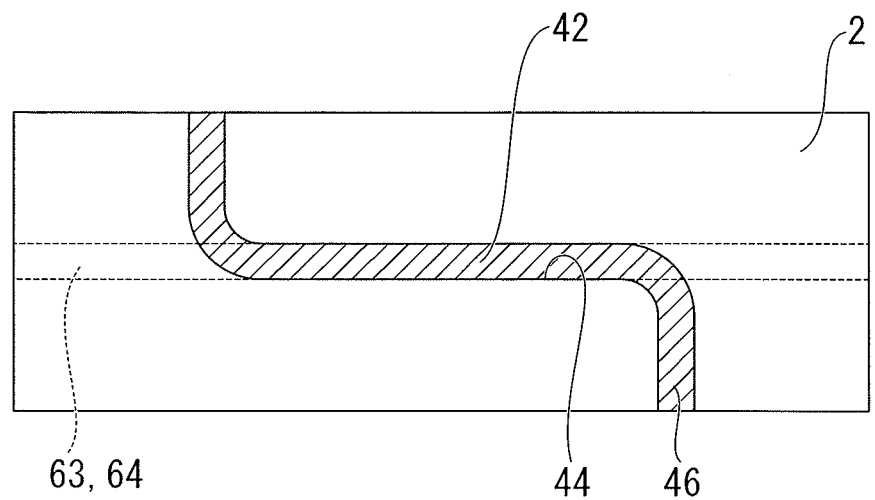
FIG. 5B is a cross-sectional view of a through wiring substrate along the line x-x of FIG. 5A.

FIGS. 5A and 5B are a plan view and a cross-sectional view of a through wiring substrate 60 according to a fifth embodiment of the invention. FIG. 5A is a plan view of the through wiring substrate 60, and FIG. 5B is a cross-sectional view of the through wiring substrate 60 along the line x-x of FIG. 5A.

The through wiring substrate 60, like the through wiring substrate 40, includes a through-wire 42, which is formed by providing a through-hole 44 that penetrates between one face (a top face or a bottom face; first face) and another face (a bottom face or a top face; second face) constituting a single substrate 2, and filling, or forming a film of, an electrically-conductive substance 46 in this through-hole 44. As shown in FIG. 3, the through-hole 44 has a first bend part 42c and a second bend part 42e. The outer peripheral part and inner peripheral part of the longitudinal cross-section of the first bend part 42c, and the outer peripheral part and the inner peripheral part of the longitudinal cross-section of the second bend part 42h, are each formed in a circular arc shape. The through wiring substrate 60 according to this embodiment further includes flow paths 63 and 64.

The explanation of the through-wire 42 of the through wiring substrate 60 is the same as that of the through-wire 42 of the through wiring substrate 40.

The flow paths 63 and 64 are both linear shape, and are arranged along the through-wire 42 parallel with both faces of the substrate 2, penetrating between both side faces of the substrate 2.

The flow paths 63 and 64 can be used for the purpose of flowing, for example, cooling fluid. Alternatively, the flow paths 63 and 64 can also be used as flow paths for the flow of living solutions such as DNA (nucleic acid), protein, and fat.

For example, when the flow paths 63 and 64 are used as flow paths for the flow of cooling fluid, it becomes possible to cool the through wiring substrate 60, so that even if a device that generates considerable heat is mounted on the substrate, the rise in temperature of the device can be effectively reduced. Moreover, even if the electrodes of the device are disposed at high density on the substrate, the rise in temperature of the device can be effectively reduced. The flow paths can be provided across the whole of the substrate 2, or concentrated on the heat-generating part of the mounted device. As the cooling fluid, for example, water ($H_2O$) can be used.

As described below, the flow paths 63 and 64 can be formed in the substrate 2 using a method similar to that for forming the through-hole 44 that becomes the through-wire 42.

As the material for the substrate 2 in the through wiring substrate of the invention described above, for example, an insulating body such as glass, sapphire, plastic, and ceramic, or a semiconductor such as silicon (Si), is used. Of these materials, insulating silica glass is preferable. When the substrate material is silica glass, this obtains advantages that there is no need to form an insulating layer on the inner wall of the through-hole as described below, there is no obstruction of high-speed transmission due to the existence of floating capacitance and the like, and the flow paths for the cooling liquid have good stability, etc.

One device conceivably mounted on both faces of the substrate is an electronic device including elements formed on a silicon substrate. When there is a large difference in the linear thermal expansion coefficients of the electronic device and the substrate, there are cases where their amounts of growth due to the temperature when mounted differ greatly. As a result, there will be deviation in the positions between the terminals of the device and the pads of the substrate, making it difficult to connect them precisely, or, depending on the case, making connection itself difficult. Since the substrate according to this embodiment can be made from silicon or glass, it can reduce difference in the linear thermal expansion coefficients of the electronic device and the substrate. Therefore, deviation in the positions between the device terminals and the pads of the substrate can be suppressed, and they can be connected precisely.

The thickness of the substrate 2 (distance from the one face to the other face; e.g. the distance from the top face to the bottom face) can be set as appropriate within a range of approximately 150 µm to 1 mm.

The electrically-conductive substances 26, 36, 46, and 56 that are filled or formed as film in the through-hole disposed in the through wiring substrate can be, for example, gold-tin (Au—Sn), copper (Cu), etc.

The patterns and cross-sectional shapes of the through-wire provided in the through wiring substrate of the invention are not limited to those illustrated above, and can be designed as appropriate. Similarly, the patterns (routes) and cross-sectional shapes of the flow paths provided in the through wiring substrate of the invention are not limited to those illustrated above, and can be designed as appropriate.

Subsequently, a method of manufacturing the through wiring substrate 60 will be explained with reference to FIG. 6A to FIG. 7B, as one example of a method for manufacturing the through wiring substrate of the invention.

Figure 6A:
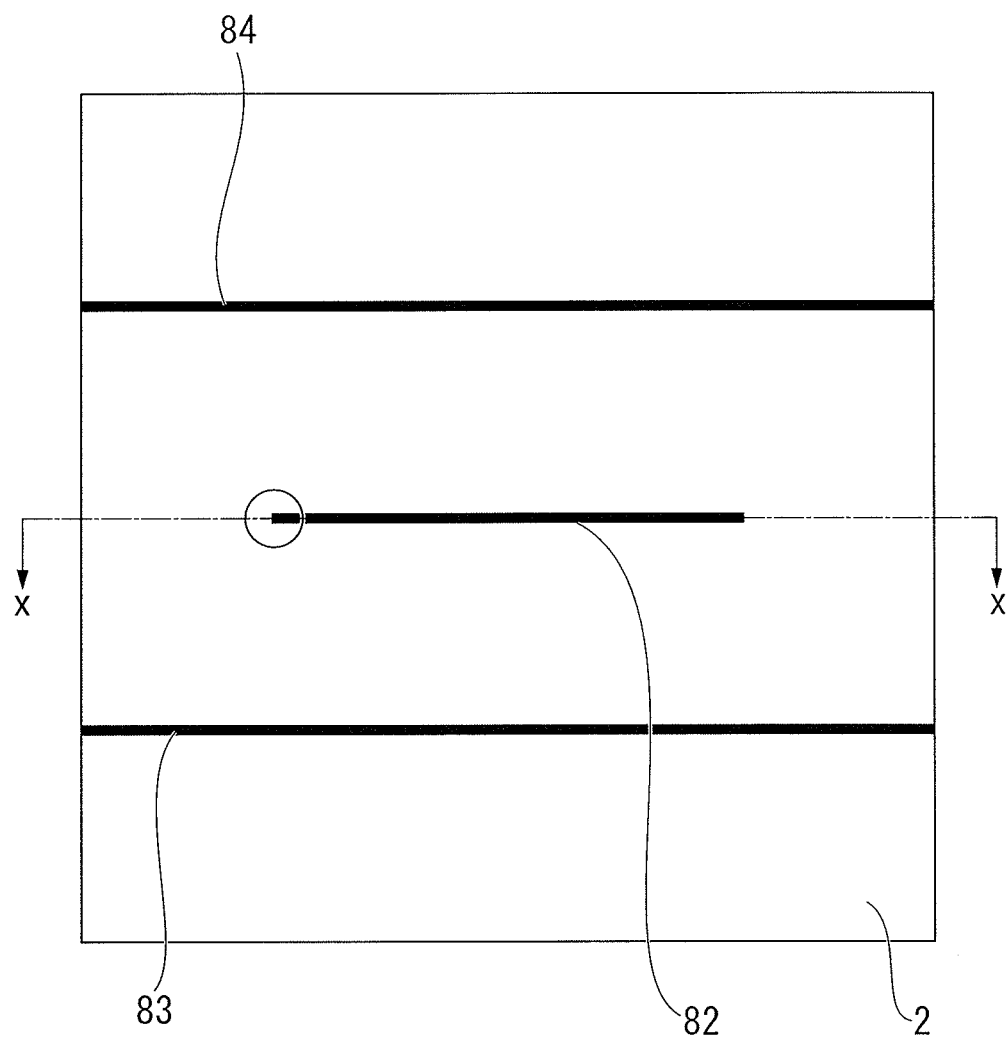
FIG. 6A is a plan view showing a method of manufacturing a through wiring substrate according to the invention.
Figure 6B:
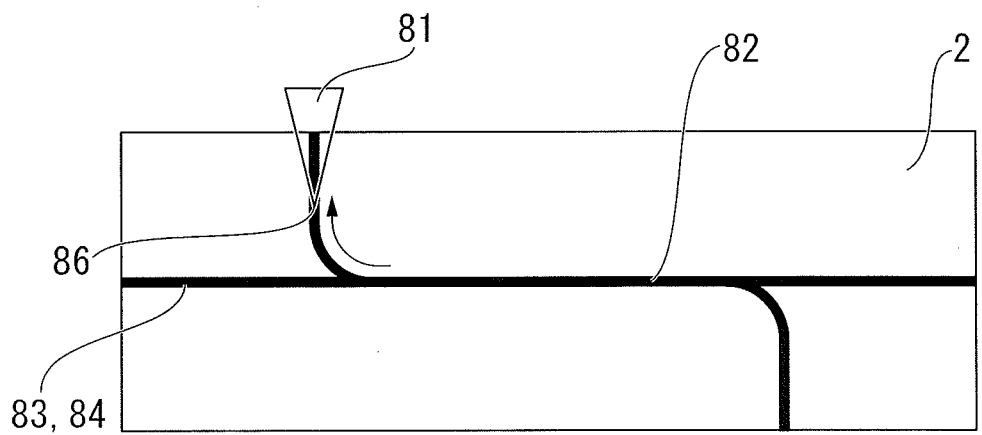
FIG. 6B is a cross-sectional view along the line x-x of FIG. 6A.
Figure 7A:
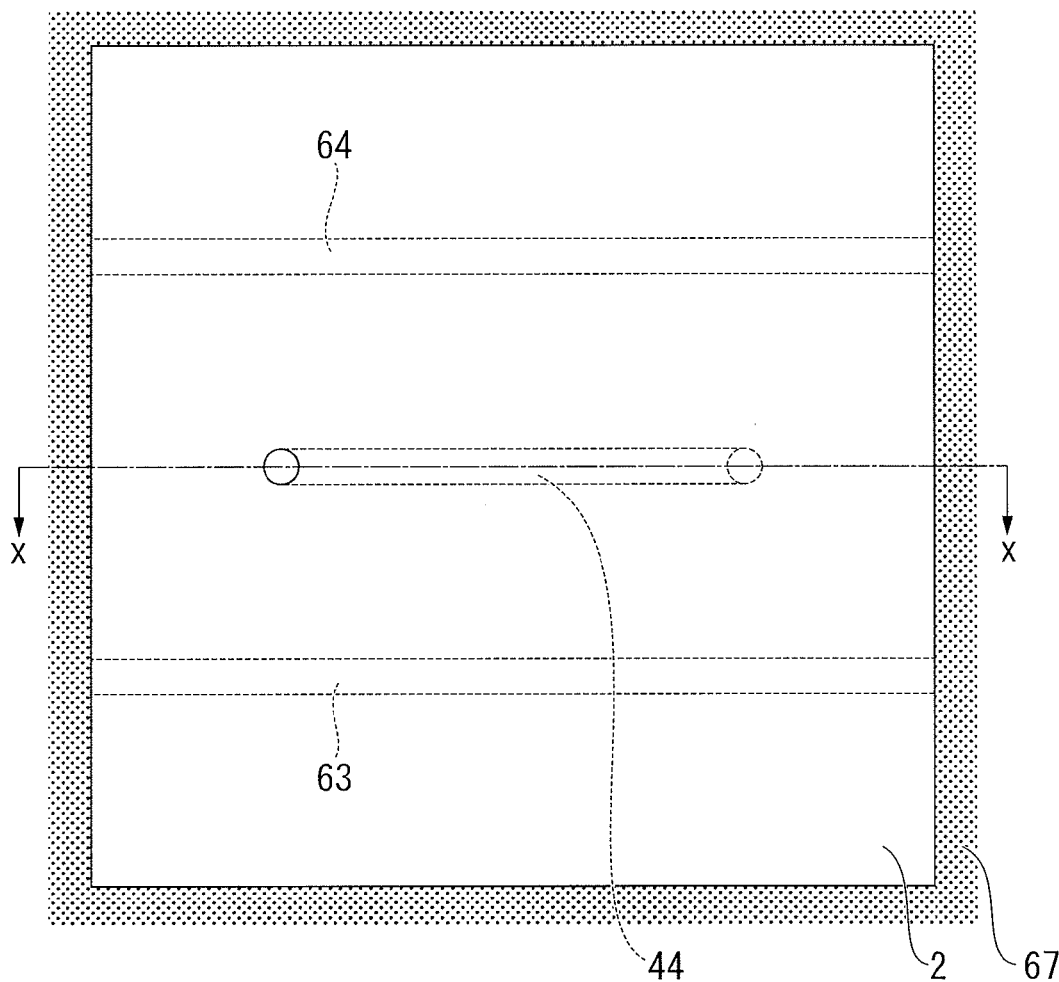
FIG. 7A is a plan view showing a method of manufacturing a through wiring substrate according to the invention.
Figure 7B:
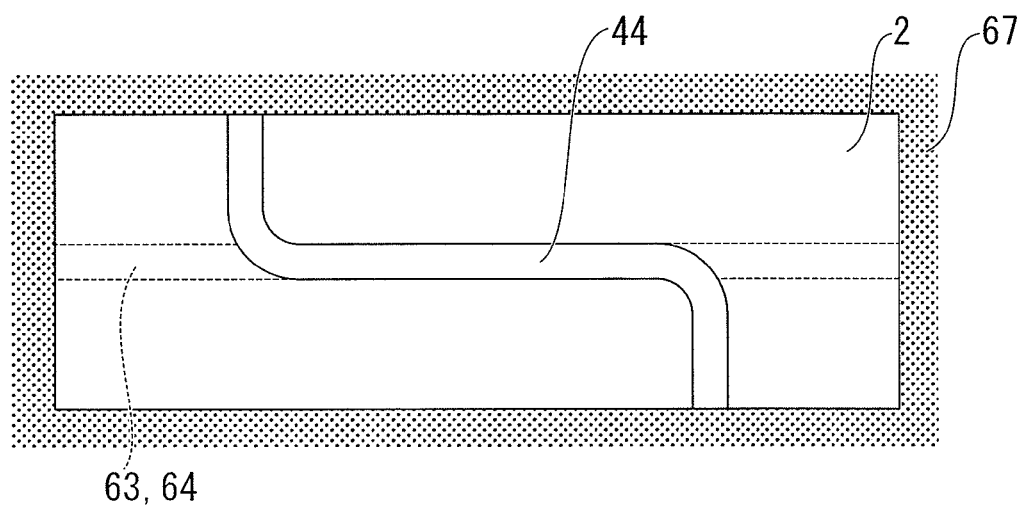
FIG. 7B is a cross-sectional view along the line x-x of FIG. 7A.
Figure 8:
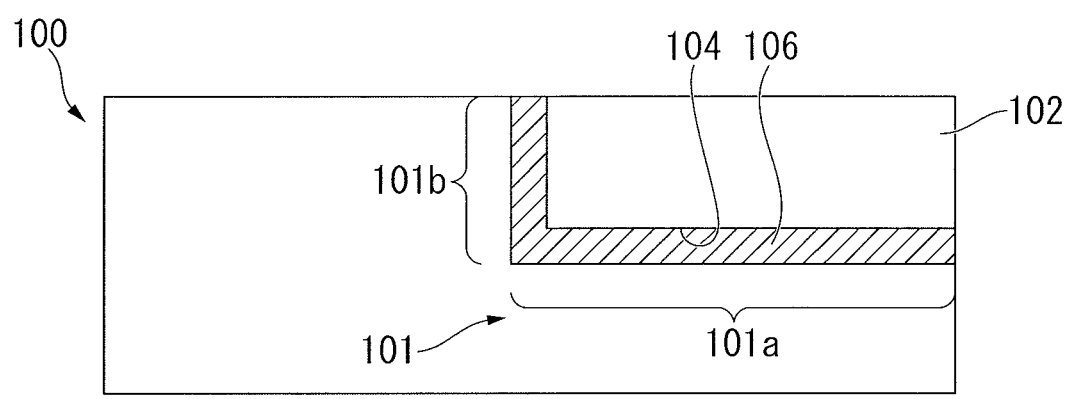
FIG. 8 is a cross-sectional view showing one example of a conventional through wiring substrate.

FIGS. 6A to 7B are plan views and cross-sectional views of a substrate 2 for manufacturing the through wiring substrate 60. FIGS. 6A and 7A are plan views of the substrate 2, and FIGS. 6B and 7B are cross-sectional views of the substrate 2 along the line x-x of the respective plan views.

<Process A>

Firstly, as shown in FIG. 6B, modified parts 82, 83, and 84 are formed in the substrate 2 by irradiating laser light 81 to the substrate 2 and modifying material of the substrate 2. The modified parts 82, 83, and 84 are provided in regions that will respectively become the through-wire 42 (through-hole 44), the flow path 63, and the flow path 64.

As the material for the substrate 2, for example, an insulating body such as glass, sapphire, plastic, and ceramic, or a semiconductor such as silicon (Si), is used. Of these materials, insulating silica glass is preferable. When the silicon material is silica glass, this obtains advantages that there is no need to form an insulating layer on the inner wall of the through-hole as described below, there is no obstruction of high-speed transmission due to the existence of floating capacitance and the like, and the flow paths for the cooling liquid have good stability, etc.

The thickness of the substrate 2 (the distance from the one face to another face; e.g. when looking from the top face to the bottom face) can be set as appropriate within a range of approximately 150 µm to 1 mm.

The laser light 81 is, for example, irradiated from one face (top face or bottom face; first face) of the substrate 2 and forms a focal point 86 at a desired position in the substrate 2. The material of the substrate 2 is modified at the position of the focal point 86. Therefore, when the position of the focal point 86 is moved (scanned) sequentially while irradiating the laser light 81, the focal point 86 is formed in the regions of the through-hole 44, the flow path 63, and the flow path 64, thereby forming the modified parts 82, 83, and 84.

A femtosecond laser is one example of a light source that can be used as the laser light 81. Irradiation of the laser light 81 can obtain the modified parts 82, 83, and 84 with diameters of, for example, several µm to several tens of µm. Also, by controlling the position of the focal point 86 of the laser light 81 in the substrate 2, it is possible to form the modified parts 82, 83, and 84 having the desired shapes.

When irradiating laser light to modify a region that will become the first bend part 42c of the through-hole 44, the laser is scanned such that, of the outer peripheral part and inner peripheral part of the longitudinal cross-section of the first bend part 42c, at least the inner peripheral part is formed in a circular arc shape, the radius of curvature of this circular arc being within a range of 10 µm to 1000 µm.

In this example, the modified part 82 is formed such that the radii of curvature R3 and r3 of the outer peripheral part and inner peripheral part of the longitudinal cross-section of the first bend part 42c are respectively 90 µm and 50 µm, and the radii of curvature R4 and r4 of the outer peripheral part and inner peripheral part of the longitudinal cross-section of the second bend part 42e are respectively 90 µm and 50 µm.

The arrow in the cross-sectional view of FIG. 6B indicates the scanning direction of the focal point 86 of the laser light 81. That is, the arrow indicates that the focal point 86 is scanned from the second conductive part (second opening of through-hole) on another face of the substrate 2 (a bottom face or a top face; second face) to the first conductive part (first opening of through-hole) on one face of the substrate 2 (a top face or a bottom face; first face). At this time, in consideration of the manufacturing efficiency, scanning is preferably performed in a single line in the direction of the arrow. That is, the scanning of the focal point 86 of the laser light 81 starts from another face which is different from the laser light incident face, and ends at the laser light incident face. For example, when the laser light 81 is incident from the top face of the substrate 2, i.e. when the top face of the substrate 2 is the laser light incident face, the focal point 86 of the laser light 81 is scanned from the bottom face, which is a different face from the incident face.

In regard to the direction of irradiating the laser light 81 when forming the modified parts 82, 83, and 84 in the manner described above, the laser light 81 can be irradiated from only one face or another face of the substrate 2, or the laser light 81 can be irradiated from both faces of the substrate 2.

Another method is to provide a hologram recording of patterns corresponding to the modified parts 82, 83, and 84 between the femtosecond laser and the substrate 2, and to irradiate the laser light through the hologram onto the substrate 2, thereby enabling the modified parts 82, 83, and 84 to be formed collectively in the substrate 2. The modified parts can then be etched to form a desired through-hole (microscopic hole) and/or flow paths.

<Process B>

As shown in FIGS. 7A and 7B, the substrate 2 with the modified parts 82, 83, and 84 formed therein is immersed in an etching solution (chemical solution) 67, and the modified parts 82, 83, and 84 removed from the substrate 2 by etching (wet etching). As a result, the through-hole 44, the flow path 63, and the flow path 64 are formed in the sections where the modified parts 82, 83, and 84 are present. In this embodiment, silica glass is used as the material for the substrate 2, and a solution with the main element of hydrofluoric acid (HF) is used as the etching solution 67. This etching procedure utilizes the phenomenon whereby the modified parts 82, 83, and 84 are etched much faster than the unmodified sections of the substrate 2, and can thus form the through-hole 44, the flow path 63, and the flow path 64 in correspondence with shapes of the modified parts 82, 83, and 84. At this stage, one end of the through-hole 44 is a first opening exposed at one face (first face) of the substrate 2. Another end of the through-hole 44 is a second opening exposed at another face (second face) of the substrate 2. A first conductive part is formed in the first opening, and a second conductive part is formed in the second opening, by filling, or forming a film of, an electrically-conductive substance 26 in the through-hole 44.

There are no particular restrictions on the etching solution 67, it being possible to use, for example, a solution with hydrofluoric acid (HF) as its main element, or a fluoro-nitric mixed acid obtained by doping hydrofluoric acid with an appropriate amount of nitric acid, or such like. It is also possible to use another chemical solution, according to the material of the substrate 2.

In the above case, the through-hole 44 to which the through-wire 42 will be formed, together with the flow paths 63 and 64, were formed in the substrate 2. If the through-hole and the flow paths are formed simultaneously in this way, the manufacturing step can be simplified and the cost can be reduced.

On the other hand, when the flow paths 63 and 64 are not formed, the modified parts 83 and 84 need not be formed in process (A) described above.

While not illustrated here, when the flow path has a bend part, the outer peripheral part and/or inner peripheral part of the longitudinal cross-section of this bend part is preferably formed in a circular arc shape. When a cooling medium is flowed through the flow path, the circular arc shape can reduce turbulence generated at the bend part.

<Process C>

In the substrate 2 formed with the through-hole 44, and the flow paths 63 and 64, a through-wire 42 is formed by filling, or forming a film of, an electrically-conductive substance 46 in the through-hole 44. For example, gold-tin (Au—Sn), copper (Cu), or such like can be used as the electrically-conductive substance 46. As for the method of making (filling or forming a film of) the electrically-conductive substance 46, a method such as molten metal suction method or supercritical fluid deposition can be used.

Preferably, when the flow paths 63 and 64 are formed in the substrate 2, the openings of the flow paths 63 and 64 are temporarily closed by providing a protective layer such as a resist over them, to ensure that the electrically-conductive substance 46 does not infiltrate the flow paths 63 and 64. For example, a resin resist, a thin film of inorganic material, or such like, can be used as this resist. By providing the protective layer, it is possible to prevent the electrically-conductive substance from being filled or formed as a film into the flow paths 63 and 64. The protective layer is removed after the electrically-conductive substance 46 has been filled or formed as a film in the through-hole 44.

The processes A to C described above obtain the through wiring substrate 60 shown in FIGS. 5A and 5B.

In addition, if desired, land parts can be formed over the conductive parts of the through-wire 42. The land parts can be formed by a method such as plating or sputtering, as appropriate.

By using the through wiring substrate of the invention, it is possible to reduce transmission loss of high-frequency signals and the like between devices mounted on two faces of a through wiring substrate, and to suppress poor conduction between the devices. Therefore, the through wiring substrate of the invention can be favourably used in various devices mounted with high density, such as a three-dimensional mount wherein devices are mounted on both faces of the substrate, a system-in-package (SiP) wherein a plurality of devices are systemized in a single package, etc.

What is claimed is:

1. A through wiring substrate comprising:
    a substrate having a first face and a second face; and
    a through-wire formed by filling, or forming a film of, an electrically-conductive substance into a through-hole which penetrates between the first face and the second face
    and which has a bend part comprising an inner peripheral part that is curved in a recessed shape and an outer peripheral part that is curved in a protruding shape, in a longitudinal cross-section of the through-hole, and has a first liner part extending in a thickness direction of the substrate and a second linear part extending in a direction parallel with the first face of the substrate, wherein:
    the outer peripheral part is a quandrant of a circular arc part with a radius of R1, and the inner peripheral part is a quandrant of a circular arc part with a radius of r1;
    centers of the quandrant of the outer peripheral part and the quandrant of the inner peripheral part are at the same position; and
    a difference between R1 and r1 is equal to a diameter of the through-wire at least in one of the first linear part and the second linear part.

2. The through wiring substrate according to claim 1, wherein at least one of the outer peripheral part and the inner peripheral part is formed in a circular arc shape with a radius of curvature within a range of 10 µm to 1000 µm in the longitudinal cross-section.

3. The through wiring substrate according to claim 1, wherein a flow path is formed in the substrate.

* * * * *